United States Patent [19]
Baker et al.

[11] Patent Number: 5,579,573
[45] Date of Patent: Dec. 3, 1996

[54] METHOD FOR FABRICATING AN UNDERCOATED CHIP ELECTRICALLY INTERCONNECTED TO A SUBSTRATE

[75] Inventors: Jay D. Baker, Dearborn; Cuong V. Pham, Northville; Robert E. Belke, Jr., West Bloomfield, all of Mich.

[73] Assignee: Ford Motor Company, Dearborn, Mich.

[21] Appl. No.: 320,812

[22] Filed: Oct. 11, 1994

[51] Int. Cl.⁶ .............. H05K 3/34; H05K 3/38; H01L 21/50
[52] U.S. Cl. .............. 29/840; 29/841; 174/259; 228/180.22; 228/254; 437/211
[58] Field of Search .............. 29/832, 840, 841; 174/259, 263; 204/192.35; 216/20, 35; 228/175, 180.1, 180.21, 180.22, 226, 248.1, 254, 262.2; 427/96; 428/901; 437/211

[56] References Cited

U.S. PATENT DOCUMENTS

| | | | |
|---|---|---|---|
| 4,381,602 | 5/1983 | McIver | 29/832 X |
| 4,604,644 | 8/1986 | Beckham et al. | 228/180.21 X |
| 4,693,770 | 9/1987 | Hatada | 29/840 X |
| 4,928,387 | 5/1990 | Mather et al. | 29/840 |
| 4,955,132 | 9/1990 | Ozawa | 29/840 |
| 4,999,699 | 3/1991 | Christie et al. | 228/175 X |
| 5,037,780 | 8/1991 | Fujimoto et al. | 29/841 X |
| 5,086,558 | 2/1992 | Grube et al. | 29/841 X |
| 5,089,440 | 2/1992 | Christie et al. | 437/211 X |
| 5,121,190 | 6/1992 | Hsiao et al. | 228/180.22 |
| 5,133,495 | 7/1992 | Angulas et al. | 228/248.1 X |
| 5,147,084 | 9/1992 | Behun et al. | 174/259 X |
| 5,279,711 | 1/1994 | Frankeny et al. | 228/180.1 |
| 5,361,491 | 11/1994 | Oomachi et al. | 29/832 X |
| 5,365,656 | 11/1994 | Dahringer et al. | 29/841 X |
| 5,384,952 | 1/1995 | Matsui | 29/840 |
| 5,386,624 | 2/1995 | George et al. | 29/832 |

FOREIGN PATENT DOCUMENTS

| | | | |
|---|---|---|---|
| 56-35448 | 4/1981 | Japan | 29/841 |
| 62-45138 | 2/1987 | Japan | 29/841 |
| 21-65613 | 6/1990 | Japan | 29/841 |

OTHER PUBLICATIONS

"Gold Ball Bumps For Adhesive Flip Chip Assembly", R. Aschenbrenner et al, Technische Universitat Berlin, Germany, 1995.

IBM Technical Disclosure Bulletin, vol. 10, No. 4, Sep. 1967, pp. 399–400.

*Primary Examiner*—Peter Vo
*Attorney, Agent, or Firm*—Peter Abolins; Roger L. May

[57] ABSTRACT

Method for fabricating an undercoated chip electrically interconnected to a substrate. The method includes the initial step of depositing a predetermined quantity of a liquid undercoat material onto the chip or the substrate. The method continues with the step of interconnecting the chip to the substrate so as to form an electrical interconnection bond therebetween. Finally, the method concludes with the step of heating, reflowing and curing the undercoat material during or after the step of electrically interconnecting the chip to the substrate.

16 Claims, 1 Drawing Sheet

METHOD FOR FABRICATING AN UNDERCOATED CHIP ELECTRICALLY INTERCONNECTED TO A SUBSTRATE

TECHNICAL FIELD

This invention relates to fabricating an undercoated chip. In particular, this invention relates to pre-dispensing an undercoat material onto a chip or a substrate prior to electrical interconnection between the chip and the substrate.

BACKGROUND ART

The process of undercoating a chip significantly increases the reliability of the chip when mounted to a printed wiring board interconnected substrate. Conventional techniques for applying undercoat material include dispensing the undercoat material after the electrical interconnection is made between the chip and the substrate. The dispensed undercoat is then cured in a separate process step.

Chip attach methods using C4 solder ball technology are well known in the art. Using conventional techniques, chips with C4 solder balls are aligned with a relief area (dimple, cavity, or the like) or connection pads on a substrate and pressed into place.

The techniques used for sealing the chips attached to the substrate include injecting sealant material around the periphery of the chip/substrate interface or completely coating the chip and the substrate assembly with sealing material, as well as allowing sealant to flow between the substrate and chip, around the solder balls. Injecting sealant around the periphery does not provide a continuous layer of sealing material and leaves some C4 joints exposed under the chip.

One known method of applying undercoat material to a chip prior to electrical interconnection is disclosed in U.S. Pat. No. 5,279,711 ('711). The '711 reference discloses a method of simultaneously forming a C4 solder connection and sealing the chip/substrate electrical interface utilizing a thin thermoplastic or thermoset material bonded to the top of the substrate prior to the attachment of a chip.

However, the '711 reference discloses a method of attaching and sealing a chip and a substrate in which the substrate includes cavities of a diameter and depth that take into account the statistical variance in the dimensions of C4 solder balls. The method of applying the layer of sealing material to the substrate includes offset printing techniques using a master template having projections with dimensions such that the sealant/adhesive material is applied on the substrate surface while bridging the cavities where the sealant/adhesive materials must not be applied. The material, therefore, is applied on the substrate where the cavities are not located.

The known prior art fails to disclose a method of applying a sealant/adhesive material to a chip prior to electrical interconnection with a substrate which does not require definition of the adhesive surface prior to applying the material to the chip or substrate. In addition, the known prior art fails to disclose a method of applying a sealant/adhesive material to a chip not having C4 solder balls prior to electrical interconnection with a substrate.

Therefore, a need exists for a method and system of applying adhesive/sealant material to a chip or substrate prior to the electrical interconnection therebetween which is quick, reliable, less expensive, and conducive to high volume electronics manufacture in a wide variety of chip/substrate applications.

DISCLOSURE OF THE INVENTION

It is a general object of the present invention to provide a method for fabricating an undercoated chip electrically interconnected to a substrate.

It is another object of the present invention to provide a method of depositing an undercoat material to a chip or substrate prior to the electrical interconnection therebetween.

It is a further object of the present invention to provide a method of depositing an undercoat material to a chip or substrate prior to the electrical interconnection therebetween which is quick, reliable, less expensive, and conducive to high volume electronics manufacture in a wide variety of chip/substrate applications.

It is yet another object of the present invention to provide a method of depositing an undercoat material to a plurality of chips arranged in an array on an undiced wafer or a diced and stretched wafer prior to attaching the chips to the substrate.

In carrying out the above objects and other objects, features, and advantages of the present invention, a method is provided for applying an undercoat material to a chip or substrate prior to the electrical interconnection therebetween.

The method includes the initial step of depositing the liquid undercoat material to the chip or substrate. The chips may be arranged in an array on an undiced wafer or diced and arranged for mass production. The liquid undercoat material may be deposited in a preform shape or may be deposited onto the entire bonding surface of the chip or the substrate.

In keeping with the invention, the chip is interconnected to the substrate so as to form an electrical interconnection bond therebetween. This is accomplished utilizing mass diffusion bonding.

Finally, the electrically interconnected chip/substrate pair is subjected to elevated temperatures sufficient to reflow and cure the pre-dispensed undercoat material either during or after the electrical interconnection step.

The above objects and other objects, features, and advantages of the present invention, are readily apparent from the following detailed description of the best mode for carrying out the invention when taken in connection with the accompanying drawings.

BRIEF DESCRIPTION OF THE DRAWINGS

The present invention will be apparent from the detailed description taken in conjunction with the accompanying drawings in which.

BEST MODES FOR CARRYING OUT THE INVENTION

Figure 1:
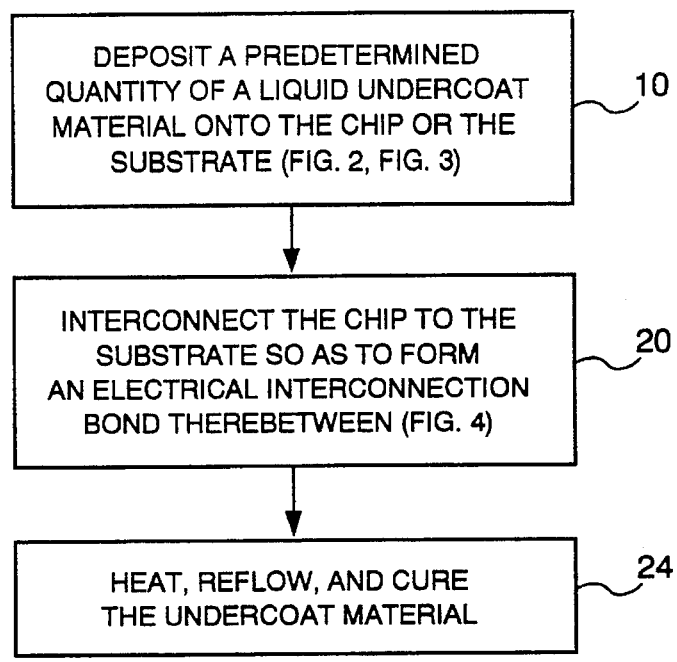
FIG. 1 is a block diagram illustrating the general sequence of steps associated with the preferred embodiment of the present invention.

Referring now to FIG. 1, the basic steps of the process are set forth in a block diagram. The other Figures are referenced in the block diagram where appropriate to permit easy understanding of the preferred order of the steps. It should be understood that some of the steps may be supplemented with additional steps.

The method begins with the step of depositing a predetermined quantity of a liquid undercoat material onto a chip or the substrate as shown by block 10. The chip may be, for example, active or passive electronic or microelectronic devices, such as integrated circuits, power transistors, capacitors, capacitor arrays, resistors, resistor arrays and networks, resonator crystals, diodes, optoelectric devices, laser chips, and other similar devices. In the integrated circuit case, the chip may be a flip-chip semiconductor device having bumped pads. The substrate is typically a printed wiring board.

Figure 2:
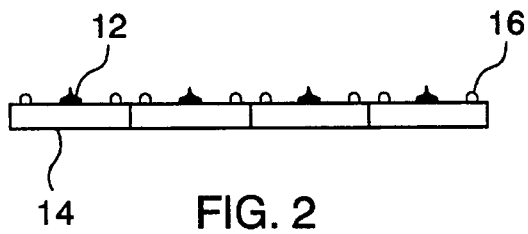
FIG. 2 is a perspective view of a plurality of chips arranged in an array on an undiced wafer.

The step of depositing the undercoat material is further illustrated in FIG. 2, in which the undercoat material 12 is pre-applied onto the individual chips 14 while the chips 14 are still arranged in an array on a wafer, The chip shown in FIG. 2 is an integrated circuit device having bumped pads 16. Alternatively, the pre-dispensing of the undercoat material 12 can be performed directly after the wafer sawing operation. In addition, the undercoat material 12 can be deposited onto the substrate rather than the chip 14.

The undercoat material 12 is deposited utilizing a solvent or a preform, such as a "hot melt" extrusion tip in the form of a "dot", to the chip in a location and volume so as not to interfere with the initial establishment of electrical contact with the substrate. Other suitable preforms include material that is cut from a ribbon spool or already formed in predetermined shapes for subsequent placement upon the chip or the substrate.

Suitable undercoat materials for the present invention include high temperature thermoplastic materials such as liquid crystal polyesters (e.g. Xydar™ or Vectra™), poly-(ether ether ketones) (e.g. ICI's PEEK), or the poly(aryl ether ketones) in either preform or extruded shape. Additional suitable thermoplastic materials include, for example, ABS-containing resinous materials (ABS/PC, ABS/polysulfone, ABS/PVC), acetals, acrylics, alkyds, allylic ethers, cellulosic esters, chlorinated polyalkylene ethers, cyanate/cyanamides, furans, polyalkylene ethers, polyamides (Nylons), polyarylene ethers, polybutadienes, polycarbonates, polyesters, polyfluorocarbons, polyimides, polyphenylenes, polyphenylene sulfides, polypropylenes, polystyrenes, polysulfones, polyurethanes, polyvinyl acetates, polyvinyl chlorides, polyvinyl chloride/vinylidine chlorides, polyetherimides, polyether ether imides, and the like and mixtures thereof. The thermoplastic material is formulated to have a sufficient linear Coefficient of Thermal Expansion (CTE) modification through appropriate filling.

The undercoating of the chip/substrate pair mechanically mitigates the substantial CTE differences between the chip (3.5 ppm/°C.) and the substrate (12–15 ppm/°C. in-plane) by maintaining local stiffness. Out-of-plane stresses are minimized by matching the CTE of the interconnection metallization. Therefore, commercially available undercoat materials are epoxy materials filled with sufficient low expansion fillers, e.g., silica or β-eucryptite, to achieve a linear CTE that matches the interconnection materials. In the case of a solder interconnection (such as the IBM C4 process), the linear CTE of the appropriate undercoat material would be 23–24 ppm/°C.

Thermosetting materials, such as high glass transition anhydride-cured epoxy compositions, would also be suitable for the present invention. Suitable thermoset materials include epoxies and modified epoxies, melamine-formaldehydes, urea formaldehydes, phelonic resins, poly(bis-maleimides), acetylene-terminated BPA resins, IPN polymers, triazine resins, and the like and mixtures thereof. The thermoset material would be dispensed in a liquid unpolymerized state onto the chip surface away from the electrical interconnects. However, a subsequent heating step is necessary to partially react the material into a "B-stageable" thermoplastic-like material, capable of reflowing and curing into a ternary matrix upon additional exposure to heat and pressure.

Figure 3:
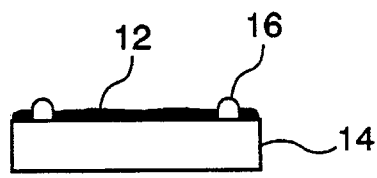
FIG. 3 is a perspective view of a single chip with pre-dispensed undercoat material.

In an alternative embodiment of the present invention, the undercoat material 12 is applied to the entire bonding area of the chip 14 or the substrate, as illustrated in FIG. 3. The undercoat material 12 maybe applied using spray coating or adhesive spinning techniques.

An additional step is required, however, in which the undercoat material 12 is etched so as to remove the undercoat material 12 from an area that is necessary to form the electrical interconnection, e.g., the bumped pads. In addition to solder alloys, the bumps may be other monolithic binary or ternary metal systems, or intrinsicly or extrinsicly conductive polymers, such as silver-filled epoxies. The method of the present invention is not limited to chips having bumped pads, but also applies to chips having wire posts, mesa or plateau configurations, or other similar electrical interconnections. Any conventional RF plasma etching process, e.g., DC, RF, or microwave, may be utilized to remove the undercoat material from the electrical contact area.

Figure 4:
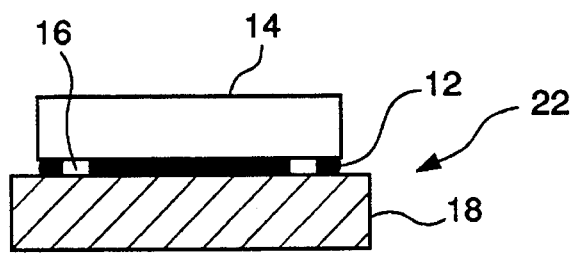
FIG. 4 is a perspective view of a chip electrically interconnected with a substrate.

The method of the present invention continues with the step of interconnecting the chip to the substrate so as to form an electrical interconnection bond between the chip 14 and the substrate 18 as shown by block 20 in FIG. 1. This is accomplished by mass diffusion bonding. For a chip having bumped pads, the electrical interconnection is accomplished utilizing a monolithic binary or ternary metal system. The electrically interconnected chip/substrate pair 22 is shown in FIG. 4.

Finally, the method of fabricating an undercoated chip concludes with the step of heating, reflowing and curing the undercoat material as shown by block 24. This step can be performed either during or after the step 20 of interconnecting the chip with the substrate.

If the undercoat material is cured after the electrical interconnection step, it can be performed at a dedicated station or during another process heat cycle such as a subsequent solder reflow step.

While the best modes for carrying out the invention have been described in detail, those familiar with the art to which this invention relates will recognize various alternative designs and embodiments for practicing the invention as defined by the following claims.

What is claimed is:

1. A method of fabricating an undercoated chip electrically interconnected to a substrate, the chip having a first and second surface and having electrical interconnections on the first surface, and the substrate having a first and second surface and having means for interconnecting on the first surface corresponding to the electrical interconnections, the method comprising:

(a) depositing a predetermined quantity of an undercoat material having sufficient low expansion fillers to achieve a linear coefficient of thermal expansion (CTE)

matching a CTE of the electrical interconnections onto the first surface of one of the chip and the substrate;

(b) etching the undercoat material from the first surface of the one of the chip and the substrate until the electrical interconnections or the means for interconnecting are exposed;

(c) connecting the electrical interconnections of the chip to the means for interconnecting of the substrate so as to form an electrical interconnection bond therebetween; and (d) heating, reflowing and curing the undercoat material during or after step (c).

2. The method of claim 1, wherein the chip is connected to the substrate by mass diffusion bonding.

3. The method of claim 1, wherein the undercoat material is a thermoplastic composition.

4. The method of claim 1, wherein the undercoat material is a B-stageable thermoset composition.

5. The method of claim 4, further comprising the step of subjecting the undercoat material to heat prior to the step of connecting the chip to the substrate.

6. The method of claim 1, wherein the chip is a flip-chip semiconductor device and the electrical interconnections are bumped pads.

7. The method of claim 6, wherein the bumped pads of the chip are connected to the substrate by a monolithic binary or a ternary metal system.

8. The method of claim 1 wherein the step of depositing the undercoat material is performed utilizing spinning or spray coating techniques.

9. The method of claim 1, wherein the undercoat material is etched utilizing plasma etching techniques.

10. The method of claim 1, wherein the chip is one of a plurality of chips arranged in an array on a wafer.

11. The method of claim 1, wherein the chip is an active electronic or microelectronic device.

12. The method of claim 1, wherein the chip is a passive electronic or microelectronic device.

13. A method of fabricating an undercoated chip electrically interconnected to a substrate, the chip having a first and second surface and having electrical interconnections on the first surface, and the substrate having a first and second surface and having means for interconnecting on the first surface corresponding to the electrical interconnections, the method comprising:

(a) depositing a predetermined quantity of an undercoat material having sufficient low expansion fillers to achieve a linear coefficient of thermal expansion (CTE) matching a CTE of the electrical interconnections onto predetermined locations on the first surface of one of the chip and the substrate, the predetermined locations not interfering with the electrical interconnections or the means for interconnecting, respectively;

(b) connecting the electrical interconnections of the chip to the means for interconnecting of the substrate so as to form an electrical interconnection bond therebetween; and (c) heating, reflowing and curing the undercoat material during or after step (c).

14. The method of claim 13, wherein the undercoat material is in a preform shape.

15. The method of claim 13, wherein the undercoat material is in an extruded shape.

16. The method of claim 13, wherein the step of depositing the undercoat material is performed utilizing a hot-melt extrusion tip.

* * * * *